(12) United States Patent
Cheng et al.

(10) Patent No.: US 8,245,174 B2
(45) Date of Patent: Aug. 14, 2012

(54) DOUBLE PATTERNING FRIENDLY LITHOGRAPHY METHOD AND SYSTEM

(75) Inventors: Yi-Kan Cheng, Taipei (TW); Ru-Gun Liu, Hsinchu (TW); Lee-Chung Lu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 204 days.

(21) Appl. No.: 12/549,087

(22) Filed: Aug. 27, 2009

(65) Prior Publication Data
US 2011/0023002 A1 Jan. 27, 2011

Related U.S. Application Data

(60) Provisional application No. 61/227,975, filed on Jul. 23, 2009.

(51) Int. Cl.
G06F 17/50 (2006.01)
(52) U.S. Cl. ........................................ 716/126; 716/130
(58) Field of Classification Search ........... 716/126–131
See application file for complete search history.

(56) References Cited

U.S. PATENT DOCUMENTS

| | | | |
|---|---|---|---|
| 6,415,426 B1* | 7/2002 | Chang et al. | 716/113 |
| 7,065,729 B1* | 6/2006 | Chapman | 716/129 |
| 7,506,289 B1* | 3/2009 | Chapman | 716/126 |
| 7,531,449 B2 | 5/2009 | Park et al. | |
| 7,879,727 B2 | 2/2011 | Postnikov et al. | |
| 7,906,253 B2 | 3/2011 | Aton et al. | |
| 2009/0068843 A1 | 3/2009 | Yang | |
| 2009/0087619 A1 | 4/2009 | Aton et al. | |
| 2009/0125866 A1 | 5/2009 | Wang | |
| 2010/0176479 A1 | 7/2010 | Postnikov et al. | |
| 2011/0023002 A1 | 1/2011 | Cheng et al. | |
| 2011/0193234 A1 | 8/2011 | Chen et al. | |

OTHER PUBLICATIONS

Tachyon DDL & Tachyon DPT, A Comprehensive Low-K, Computational Lithography Solution, pp. 1-4, Brion Technologies, 2008.
William H. Arnold, Extending 193 nm Optical Lithography, Tempe, Ariz., Semiconductor International, Sep. 1, 2006, pp. 1-5.
Hsu, Stephen et al, Double dipole lithography for 65-nm node and beyond: defect sensitivity characterization and reticle inspection, 24th Annual BACUS Symposium on Photomask Technology. Edited by Staud, Wolfgang; weed, J. Tracy. Proceedings of the SPIE, vol. 5567,pp. 1 (2004).
Double Patterning, Wikipedia, pp. 1-5, http://en.wikipedia.org/wiki/Double.patterning, Jun. 25, 2009.

(Continued)

*Primary Examiner* — Jack Chiang
*Assistant Examiner* — Binh Tat
(74) *Attorney, Agent, or Firm* — Duane Morris LLP; Steven E. Koffs

(57) ABSTRACT

A method includes receiving an identification of a plurality of cells to be included in an integrated circuit (IC) layout, including a list of pairs of cells within the plurality of cells to be connected to each other. First routing paths are identified, to connect a maximum number of the pairs of cells using one-dimensional (1-D) routing between cells within those pairs of cells. Second routing paths are selected from a predetermined set of two-dimensional (2-D) routing patterns to connect any of the pairs of cells which cannot be connected by 1-D routing. The first and second routing paths are output to a machine readable storage medium to be read by a control system for controlling a semiconductor fabrication process to fabricate the IC.

20 Claims, 9 Drawing Sheets

OTHER PUBLICATIONS

Ilan Englard et al, Novel CD-SEM overlay Method Improves Dual Trench Patterning CDU, Applied Materials Inc., Santa Clara, Calif. Semiconductor International, Feb. 1, 2008, pp. 1-3.

Nikolsky, P. et al., Netherlands, Veldhoven; Topological and model based approach to native conflicts correction and pitch decomposition for Double Patterning, Abstract, Advanced Semiconductor Manufacturing Conference, 2008, ASMC 2008. IEEE/SEMI.

M. Cho et al., Double Patterning Technology Friendly Detailed Routing, IEEE/ACM International Conference on Computer-Aided Design, pp. 506-511, Nov. 2008.

R. Kruif et al., Wafer Based Mask Characterization for Double Patterning Lithography, 24th European Mask and Lithography Conference, pp. 71-82, Jan. 2008.

K. Bubke et al., Mask Characterization for Double Patterning Lithography, Journal of Micro/Nanolithography, MEMS and MOEMS, 10 pages, Jan. 2009.

Mitra et al., RADAR: RET-Aware Detailed Routing Using Fast Lithography Simulations, Proceedings of the 42nd Design Automation Conference, pp. 369-372, Jun. 2005.

* cited by examiner

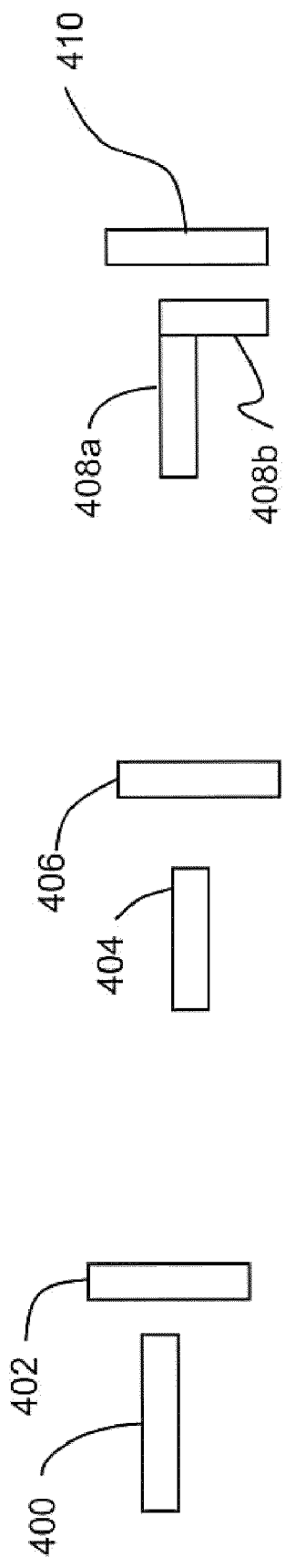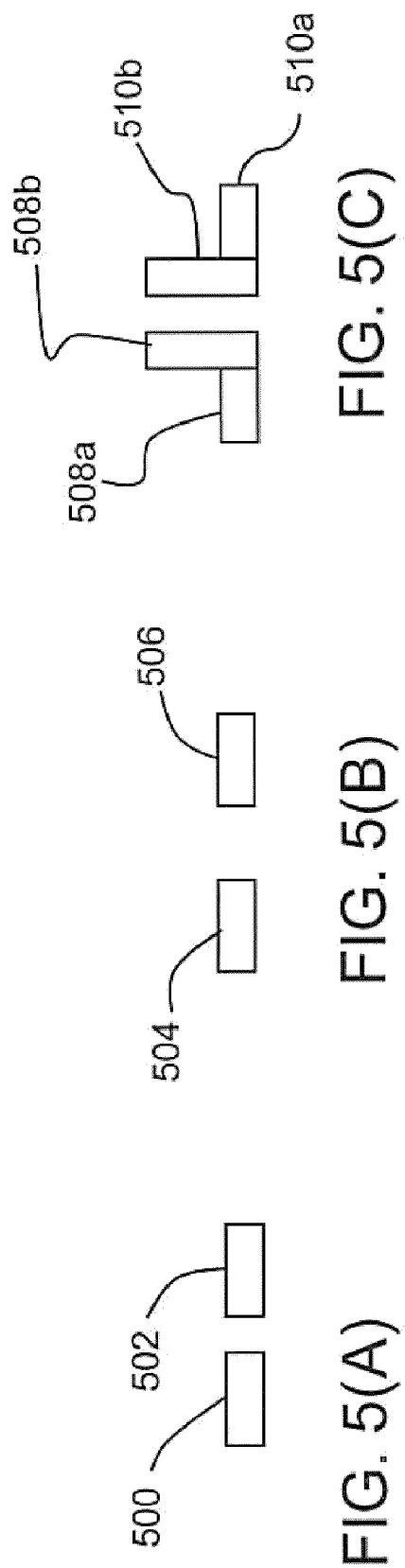

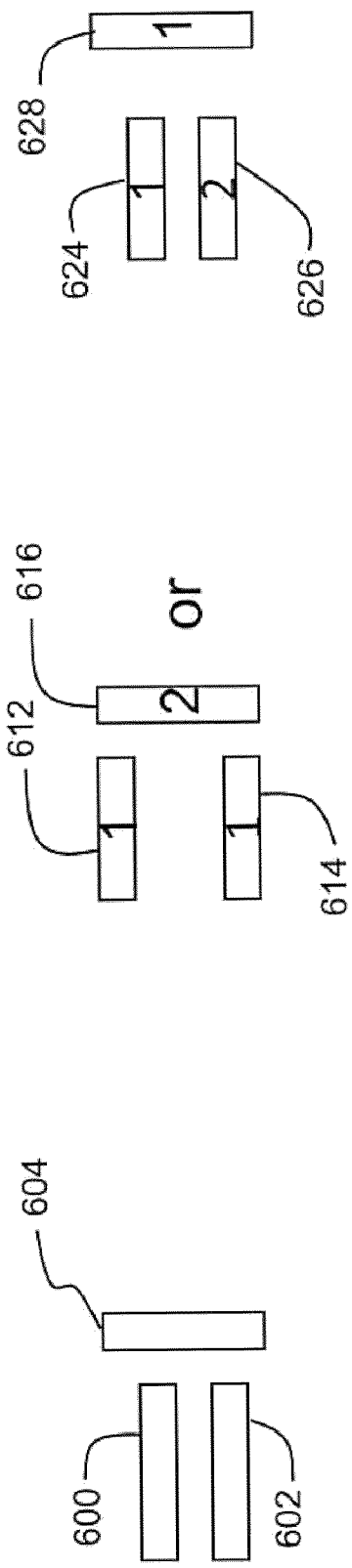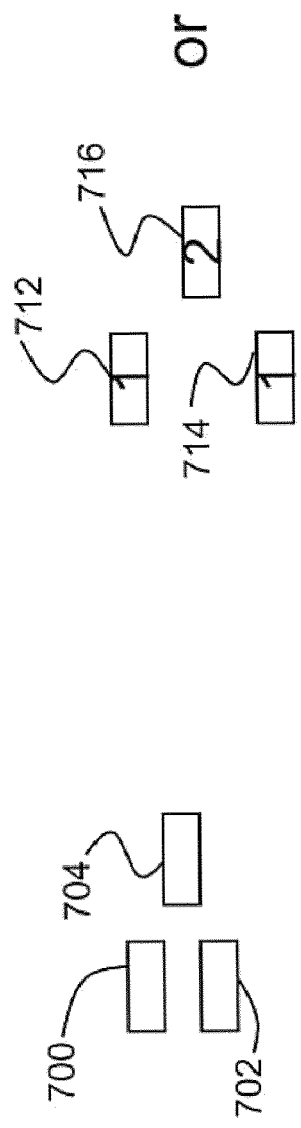

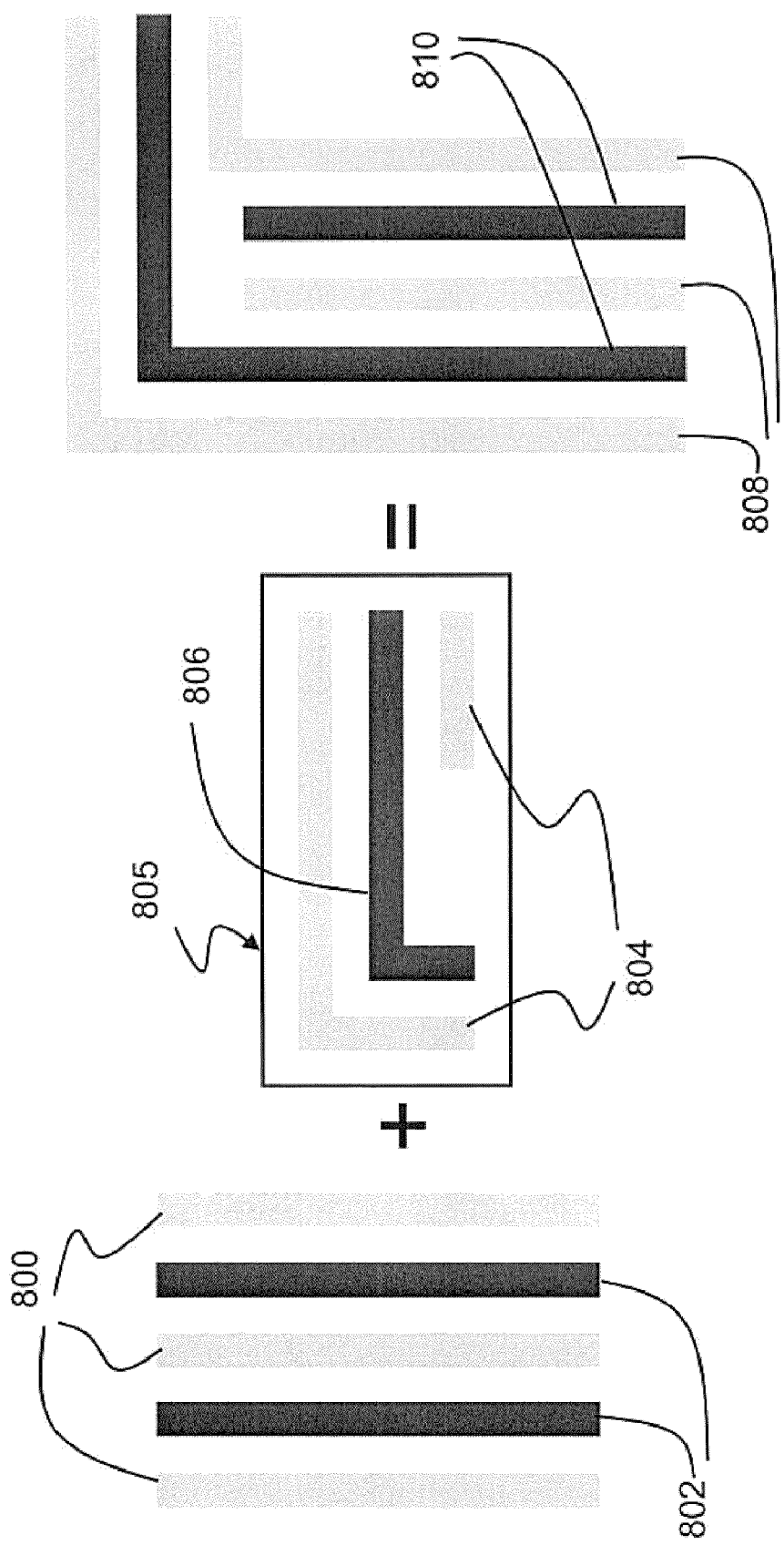

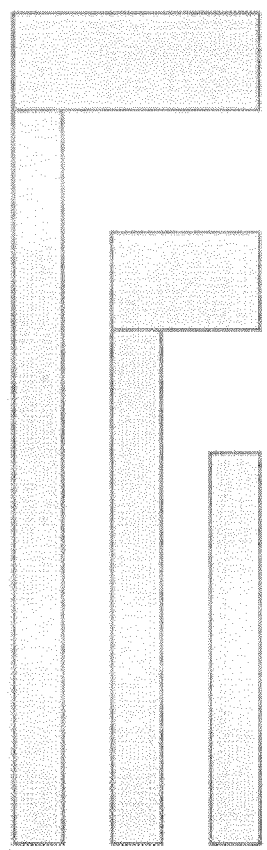
FIG. 10(B)
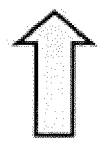
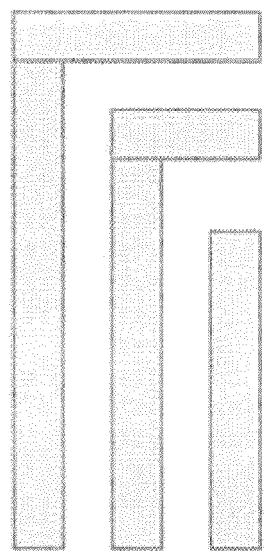
FIG. 10(A)

1102

22 nm 45 nm

DOUBLE PATTERNING FRIENDLY LITHOGRAPHY METHOD AND SYSTEM

This application claims the benefit of U.S. Provisional Patent Application No. 61/227,975, filed Jul. 23, 2009, which application is expressly incorporated by reference herein in its entirety.

FIELD OF THE INVENTION

The present disclosure relates to semiconductor fabrication generally and more specifically to double patterning.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Double exposure involves forming patterns on a single layer of a substrate using two different masks in succession. As a result, a minimum line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. The layout polygon and critical space are similar to the vertex and edge of the graph respectively. Two adjacent vertices connected with an edge should be assigned different colors. Only two "color types" can be assigned. Each pattern on the layer is assigned a first or second "color"; the patterns of the first color are formed by a first mask, and the patterns of the second color are formed by a second mask. A graph is 2-colorable only if it contains no odd-cycle and loop. Although DPT has some advantages, it is more computationally intensive than DDL.

In some cases, even if a pattern is separated into vertical and horizontal components, one or more pairs of features on a single mask are too close to each other for exposure with high resolution. If two features are so close that a high resolution exposure cannot be obtained by DDL or DPT decomposition, the pattern is said to have a "native conflict". Such a problem can be addressed by changing the layer design, possibly at great expense, or by increasing the spacing between devices, which increases the die area.

Improved methods for automating the double exposure decomposition process are desired.

SUMMARY

In some embodiments, a method includes receiving an identification of a plurality of cells to be included in an integrated circuit (IC) layout, including a list of pairs of cells within the plurality of cells to be connected to each other. First routing paths are identified, to connect a maximum number of the pairs of cells using one-dimensional (1-D) routing between cells within those pairs of cells. Second routing paths are selected from a predetermined set of two-dimensional (2-D) routing patterns to connect any of the pairs of cells which cannot be connected by 1-D routing. The first and second routing paths are output to a machine readable storage medium to be read by a control system for controlling a semiconductor fabrication process to fabricate the IC.

In some embodiments, an electronic design automation (EDA) tool comprises a router for receiving an identification of a plurality of cells to be included in an integrated circuit (IC) layout, including a list of pairs of cells within the plurality of cells to be connected to each other. The router has a set of design rules for identifying first routing paths to connect a maximum number of the pairs of cells using one-dimensional (1-D) routing between cells within those pairs of cells. A computer readable storage medium contains a predetermined set of two-dimensional (2-D) routing patterns. The router is configured for selecting second routing paths from the predetermined set of 2-D routing patterns to connect any of the pairs of cells which cannot be connected by 1-D routing. The EDA tool is configured for outputting the first and second routing paths to be read by a control system for controlling a semiconductor fabrication process to fabricate the IC.

In some embodiments, a computer readable storage medium encoded with computer program code, such that when the computer program code is executed by a processor, the processor performs a method comprising receiving an identification of a plurality of cells to be included in an integrated circuit (IC) layout, including a list of pairs of cells within the plurality of cells to be connected to each other. First routing paths are identified, to connect a maximum number of the pairs of cells using one-dimensional (1-D) routing between cells within those pairs of cells. Second routing paths are selected from a predetermined set of two-dimensional (2-D) routing patterns to connect any of the pairs of cells which cannot be connected by 1-D routing. The first and second routing paths are output to a machine readable storage medium to be read by a control system for controlling a semiconductor fabrication process to fabricate the IC.

BRIEF DESCRIPTION OF THE DRAWINGS

FIGS. 4 and 5 are diagrams showing examples of DDL friendly 2-D patterns.

FIGS. 6 and 7 are diagrams showing examples of DPT friendly 2-D patterns.

FIG. 8 shows an example of a routing pattern generated by the method suitable for DPT.

FIG. 10 is an example of a complex routing that may be generated for a specific situation.

DETAILED DESCRIPTION

Figure 1:
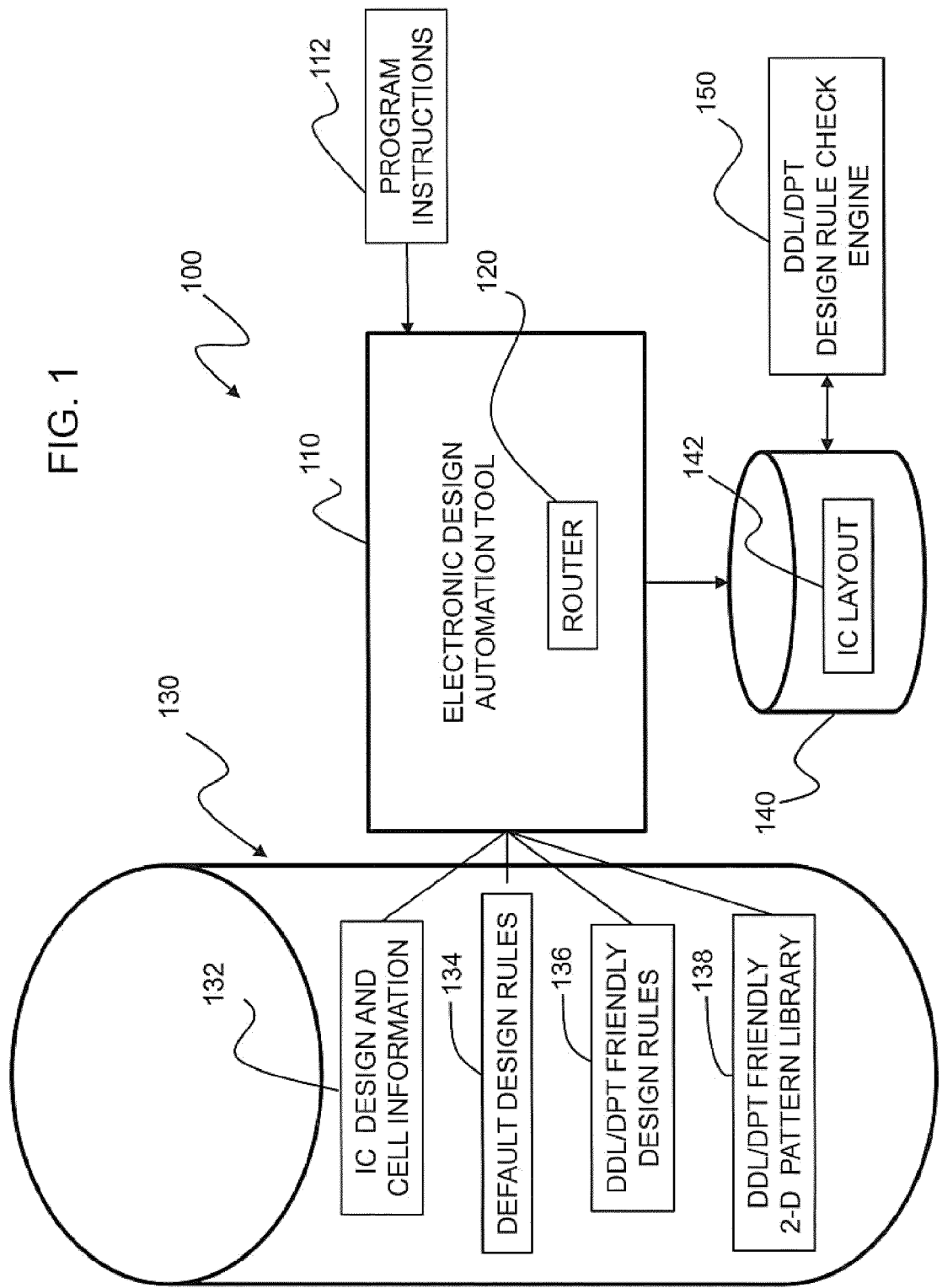
FIG. 1 is a block diagram of an exemplary system.

This description of the exemplary embodiments is intended to be read in connection with the accompanying drawings, which are to be considered part of the entire written description. In the description, relative terms such as "lower," "upper," "horizontal," "vertical,", "above," "below," "up,"

"down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

A system is described herein for design rule violation free layout by construction. The method applies to both dipole-dipole lithography (DDL) and double patterning technology (DPT). The method results in a compact routing area by avoiding overly relaxed rules (which increase line spacing and die area). A predetermined set of allowable 2-D patterns is provided to the router, which the router can use without interrupting the routing flow to perform computationally intensive DDL/DPT compatibility checks. There is no need for computationally expensive lithography engine interaction during the routing process, which saves time in the design flow.

FIG. 1 shows a system 100 having an electronic design automation (EDA) tool 110 such as "IC COMPILER"™, sold by Synopsis, Inc. of Mountain View, Calif., including a router 120 such as "ZROUTE"™, also sold by Synopsis. Other EDA tools 110 may be used, such as the "VIRTUOSO" custom design platform or the Cadence "ENCOUNTER"® digital IC design platform may be used, along with the "VIRTUOSO" chip assembly router 120, all sold by Cadence Design Systems, Inc. of San Jose, Calif. The EDA tool 110 is a special purpose computer formed by retrieving stored program instructions from a computer readable storage medium 112 and executing the instructions on a general purpose processor.

One or more computer readable storage media 130 are provided to store input data used by the EDA tool 110. The router 120 is capable of receiving an identification of a plurality of cells to be included in an integrated circuit (IC) layout, including a list 132 of pairs of cells within the plurality of cells to be connected to each other.

The router may be equipped with a set of default design rules 134, which may be used for larger technology nodes (e.g., 90 nm), which do not require DDL or DPT.

The router 120 has a set 136 of "DDL/DPT friendly" design rules for use in smaller technologies which use double exposure techniques. The term "DDL/DPT friendly" refers to patterns which are capable of being decomposed for DDL or DPT, so that each of the two masks used to pattern a single layer can perform an exposure with high resolution.

For example, in some embodiments, the design rules 136 further configure the router 120 for locating connecting lines and vias exclusively on a manufacturing grid. This is a change from the traditional practice of allowing placement of vias anywhere along the lines to which they are connected.

In some embodiments, the set 136 of design rules further configures the router 120 for positioning a plurality of connecting lines, so that no pair of lines within the plurality of connecting lines are separated from each other by any of a finite number of predetermined pitch values. This allows designation of one or more "forbidden pitches" which are known to cause lithography problems for a particular technology. The forbidden pitches are not used by the router 120.

FIG. 4 shows an example of applying a design rule. In FIG. 4(A), the spacing between two perpendicular line segments 400, 402 is too small to form the patterns using a single mask. In FIG. 4(B), the spacing between line segments 404 and 406 is made larger, but size of the layout may be affected. In FIG. 4(C), an angle comprising segments 408a and 408b and a first line segment 410 parallel to one side 408b of the angle and separated from the one side by a first distance, is substituted in place of a pair of perpendicular second line segments 400, 402 separated from each other by the same first distance, where the pair of perpendicular second line segments 400, 402 would normally be generated by a place and route tool 120 and the first distance is less than a threshold distance specified by the design rule. The pattern in FIG. 4(C) is suitable for DDL.

FIG. 5 shows another example applying a design rule, using a pair of angles 508a, 508b and 510a, 510b, in place of a pair of in-line first line segments 500, 502, if the pair of first line segments 500, 502 would normally be generated by a place and route tool 120 and has a first distance between adjacent ends that is less than a threshold distance specified by the design rule. Each angle 508a, 508b and 510a, 510b has a second line segment 508b, 510b, the second line segments being parallel to each other and separated by the first distance. The pattern in FIG. 5(C) is suitable for DDL, and avoids increasing the distance between patterns 504, 506, as shown in FIG. 5(B).

FIG. 6 shows an example of applying a design rule for DPT. The pattern in FIG. 6(A) is not colorable, because the three line segments 600, 602 and 604 cannot be split between two masks in any way that allows high resolution exposure ("non-colorable"). FIGS. 6(B) and (C) show two alternative patterns that are colorable and DPT friendly. In FIG. 6(B), line segments 612 and 614 are formed by the first mask, with a larger line spacing between them, and segment 616 is formed by the second mask. In FIG. 6(C), the spacing between the horizontal segments 624 and 626 is not changed, but the distance between vertical segment 628 and the nearest ends of segments 624, 626 is increased relative to FIG. 6(A). This configuration allows segments 624 and 628 to be formed by the first mask, and segment 626 by the second mask. Alternatively, segments 626 and 628 can be formed by the first mask, and segment 624 by the second mask. One of ordinary skill in the art understands that the selection of which pattern 624 or 626 to put on the second mask may be made based on the other patterns (not shown) in the neighborhood.

FIG. 7 shows another example of applying a design rule for DPT. The pattern in FIG. 7(A) is not colorable, because the three line segments 700, 702 and 704 cannot be split between two masks in any way that allows high resolution exposure ("non-colorable"). In FIG. 7(B), line segments 712 and 714 are formed by the first mask, with a larger line spacing between them, and segment 716 is formed by the second mask. In FIG. 7(C), the spacing between the segments 724 and 726 is not changed, but the distance between segment 728 and the nearest ends of segments 724, 726 is increased relative to FIG. 7(A). This configuration allows segments 724 and 728 to be formed by the first mask, and segment 726 by the second mask. Alternatively, segments 726 and 728 can be formed by the first mask, and segment 724 by the second mask.

These are only examples, and any design rule may be used, which is determined to improve the capability to decompose a pattern into two masks for high resolution double exposure lithography.

In some embodiments, in determining routing paths to connect two cells, the router first determines whether the connections can be made by one-dimensional (1-D) routing. If 1-D routing is possible, then 1-D routing must be used. 1-D routing results in "DDL/DPT friendly" designs. Router 120 is configured for identifying first routing paths to connect a maximum number of the pairs of cells using one-dimensional 1-D routing between cells within those pairs of cells.

Where it is not possible to use exclusively 1-D routing (e.g., such as areas with via enclosure around the redundant via or rectangular via is needed for yield enhancement), the router 120 next looks to a library 138 of predetermined, pre-approved 2-D patterns. The computer readable storage medium 130 contains a library 138 having a predetermined set of DDL/DPT friendly two-dimensional (2-D) "routing cells." Traditionally, the logic functions have been implemented in standard library cells selected by the IC designer, but the router 120 of the EDA tool 110 performs an automated custom design of both signal connect lines and power supply lines, which it lays out at any location on a routing grid (approximately a 50 nm grid), and connecting vias, which may be positioned anywhere, including off-grid locations. In the embodiment of FIG. 1, the library 138 of predetermined 2-D routing patterns is a set of routing path designs which have been approved by the IC designer (or developer of library 138) for use in IC layouts which are to be double exposed using DDL or DPT. For example, library 138 may include patterns to connect the most widely used pairings of connected logic cells, and may include enough patterns so that all but a relatively small number of connections between cells can be made using either 1-D routing and/or one or more of the predetermined 2-D routing patterns in library 138.

In the system 100, the router is configured for selecting routing paths from the predetermined set 138 of 2-D routing cells to connect any of the pairs of cells which cannot be connected by 1-D routing. Thus, the router 120 is provided a set of standardized routing patterns, which can be used like "routing cells" to connect the standardized library cells.

The EDA tool 110 is configured for outputting a complete IC layout including the first and second routing paths to be read by a control system (not shown) for controlling a semiconductor fabrication process to fabricate the IC.

The router 120 may generate 1-D patterns (connecting lines) to connect two logic cells or to connect a logic cell to one of the pre-approved DPT/DDL friendly 2-D routing patterns in library 138 (such as the examples shown in FIGS. 8 and 9). It is also possible that, the router 120 will be tasked with connecting two library cells for which 1-D routing is not possible, and the 2-D pattern library 138 of predetermined routing patterns does not contain any appropriate pattern. In either event, router 120 will attempt to generate a custom routing pattern in compliance with the DDL/DPT friendly design rules 136. Because router 120 may still generate an IC layout containing some custom routing patterns, the system further comprises a module 150 for performing double patterning decomposition design rule checks on the complete set of the routing paths for the IC layout, and correcting any design rule violation found in the complete set of routing paths. In some embodiments, this module is incorporated into the EDA tool for checking at the completion of the layout process. In other embodiments, the DDL/DPT design rule check is a standalone tool, which may be run on the same computer as the EDA tool, or on a different computer.

Figure 2:
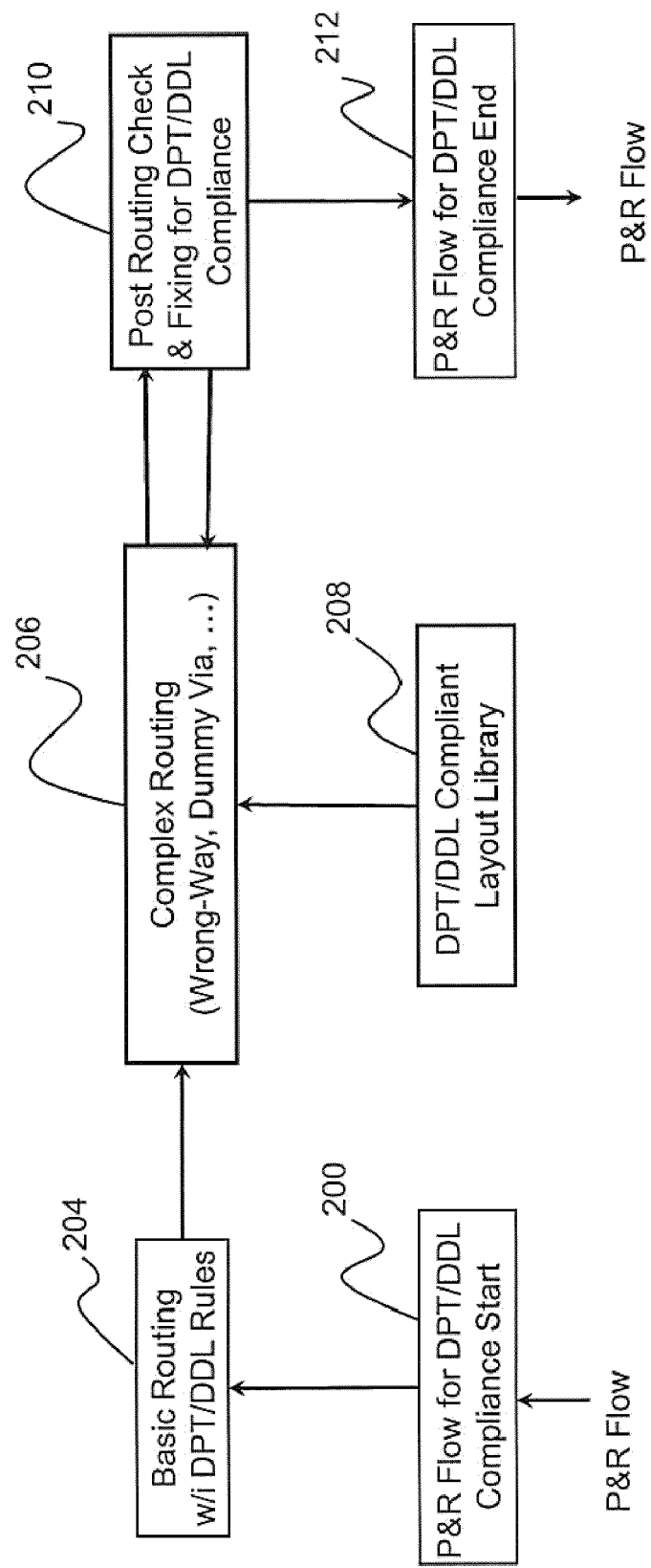
FIG. 2 is a diagram of an method of using the system of FIG. 1.

FIG. 2 is an example of a method of using the system to generate a layout with predominantly 1-D routing.

At block 200, the place and route flow for DPT/DDL compliant design is started.

At step 204, basic routing is performed using: 1-D routing (wherever possible).

At block 206, complex routing is performed, using pre-approved 2-D routing patterns from the 2-D routing pattern library 138, if 1-D routing is not possible. The custom generated routings in compliance with the DPT/DDL design rules 136 connect to the patterns from library 138, and connect cells where 1-D routing is not possible and there is no suitable 2-D routing pattern in the library 138. The library 138 may also contain patterns for special situations, such as the example shown in FIG. 10, the large square pattern 1102 in FIG. 11B, rectangular-non-square vias, double vias, dummy vias, or the like. In FIG. 10(B), a larger perpendicular direction CD/Space is provided relative to FIG. 10(A). This structure may be used with SDL, Single-Dipole Lithography, in a single exposure with Dipole to push the minimal pitch to 80 nm in one direction; the CD/space of the other (horizontal) direction would be enlarged. The structure in FIG. 10(B) simplifies dummy via insertion.

At block 210, the post routing checks are performed with the DDL/DPT design rule check engine 150, for DPT/DDL compliance, and corrections are made if appropriate. For example, the DDL/DPT design rule check engine may perform a DDL or DPT decomposition simulation, to confirm that the layout can be passed to the foundry for use in a semiconductor process without problems.

At block 212, the place and route flow for DPT/DDL compliant design ends.

Figure 3:
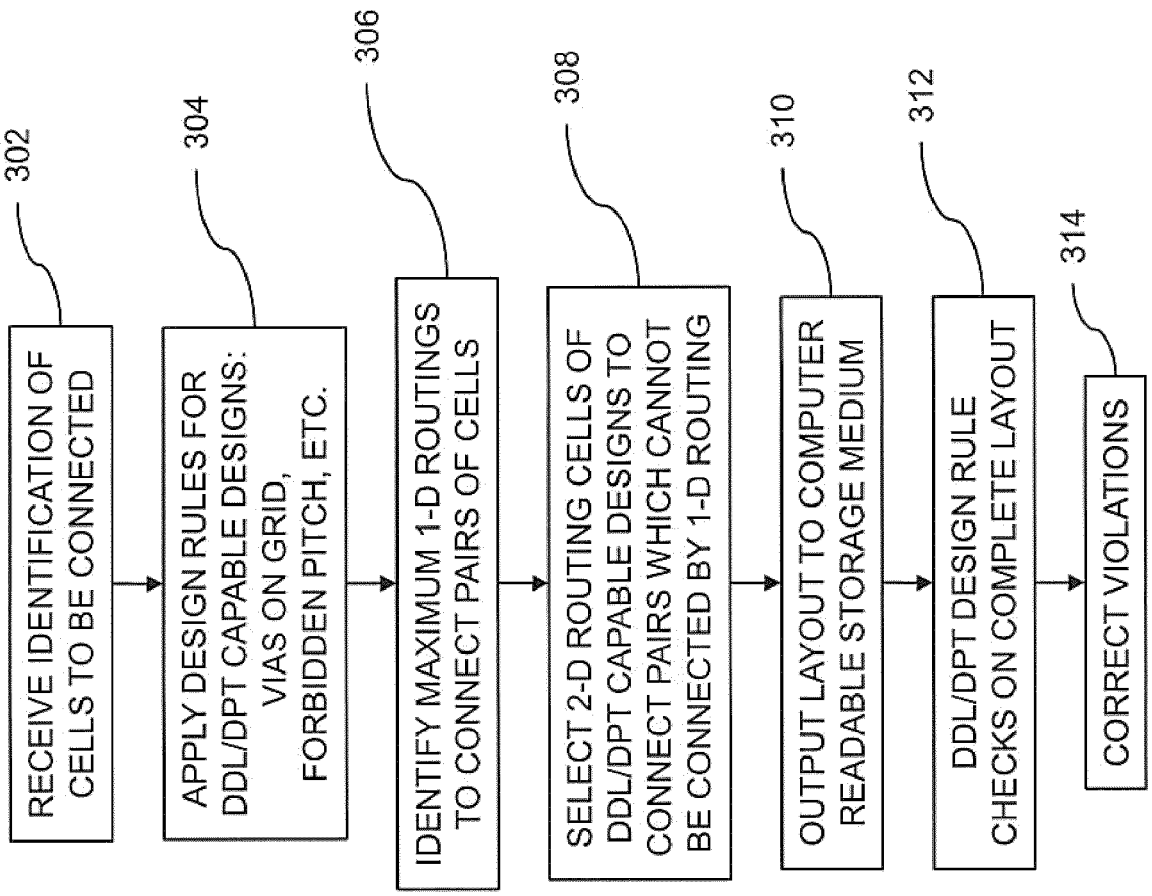
FIG. 3 is a detailed flow chart of a method of using the system of FIG. 1.

FIG. 3 is a detailed flow chart of a method of using the system of FIG. 1.

At step 302, the place and route engine of EDA tool 110 receives an identification of a plurality of cells to be included in an integrated circuit (IC) layout, including a list of pairs of cells within the plurality of cells to be connected to each other.

At step 304, the router 120 applies the design rules for DDL or DPT capable designs, such as locating vias on the manufacturing grid, avoiding forbidden pitches so that no pair of lines within the plurality of connecting lines are separated from each other by any of a finite number of predetermined pitch values, or the like.

At step 306, the router 120 identifies first routing paths to connect a maximum number of the pairs of cells using one-dimensional (1-D) routing between cells within those pairs of cells (i.e., uses 1-D routing wherever possible).

Figure 9C:
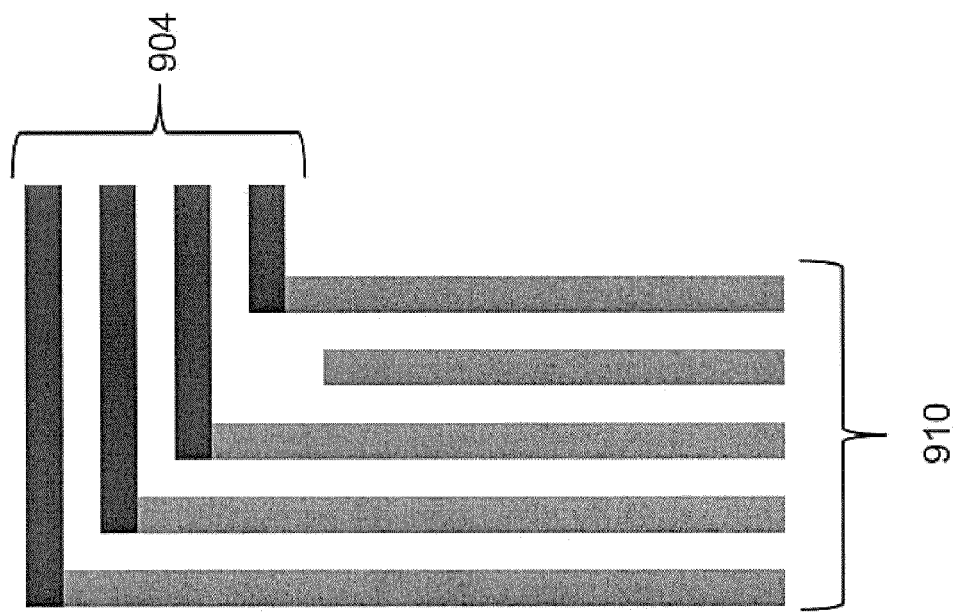
FIG. 9 shows an example of a routing pattern generated by the method suitable for DDL.
Figure 9B:
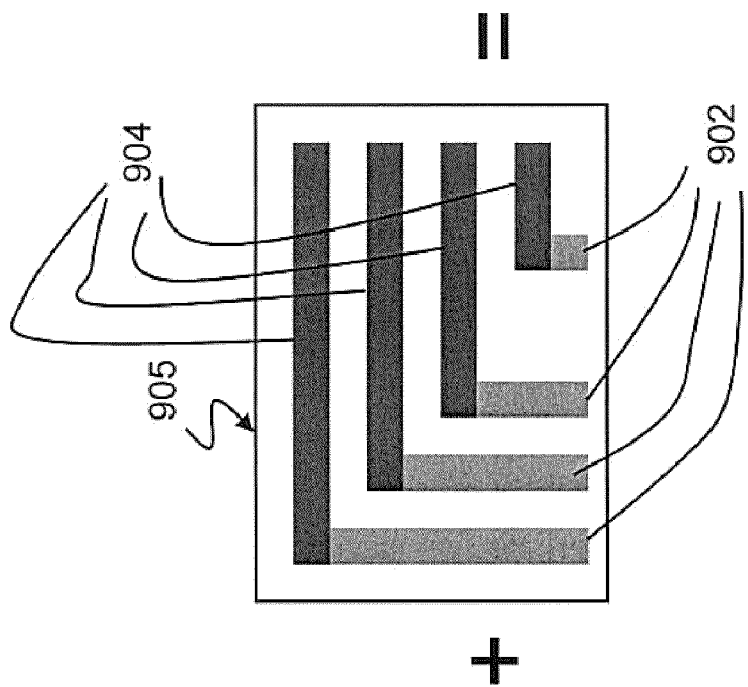
Figure 9A:
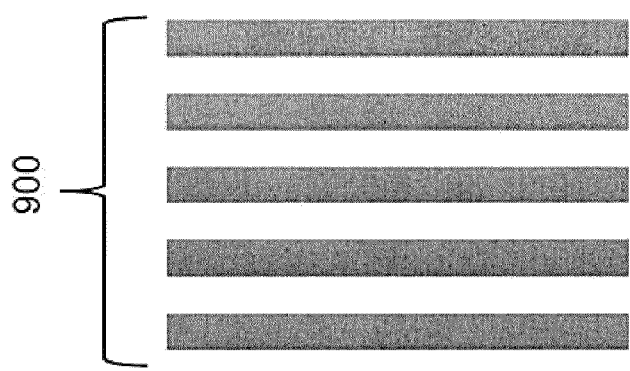

At step 308, the router selects second routing paths from a predetermined set of two-dimensional (2-D) routing patterns to connect any of the pairs of cells which cannot be connected by 1-D routing. The router 120 may combine 1-D patterns (e.g., FIG. 8(A)) with the 2-D pattern (e.g., FIG. 8(B)) to provide the desired routing (e.g., FIG. 8(C)) for DPT compliant decomposition. In FIGS. 8(A) to (C), the first color patterns 800 are combined with the patterns 804 of the pattern 805 from the 2-D library 138 to form the first color patterns 808. The second color patterns 802 are combined with the pattern 806 of the pattern 805 from the 2-D library 138 to form the second color patterns 810. The patterns of each color can be formed by a respective mask. Alternatively, the router 120 may combine 1-D patterns (e.g., FIG. 9(A)) with the 2-D pattern (e.g., FIG. 9(B)) to provide the desired routing (e.g., FIG. 9(C)) for DDL compliant decomposition. In FIGS. 9(A) to (C), the vertical segments 900 combine with the vertical portions 902 of the pattern 905 from the 2-D library 138 to form the vertical portions 910 of the DDL compliant 2-D routing for the first mask, while the horizontal patterns 912 are formed by the second mask.

Referring again to FIG. 3, at step 310, the EDA tool 110 outputs the first and second routing paths to a machine readable storage medium 140 to be read by a control system for controlling a semiconductor fabrication process to fabricate the IC.

At step 312, the DDL/DPT design rule checks are performed on the complete layout by the engine 150, for example using DDL or DPT simulation.

At step 314, any violations of the DDL/DPT design rules are corrected, if appropriate.

Figure 11B:
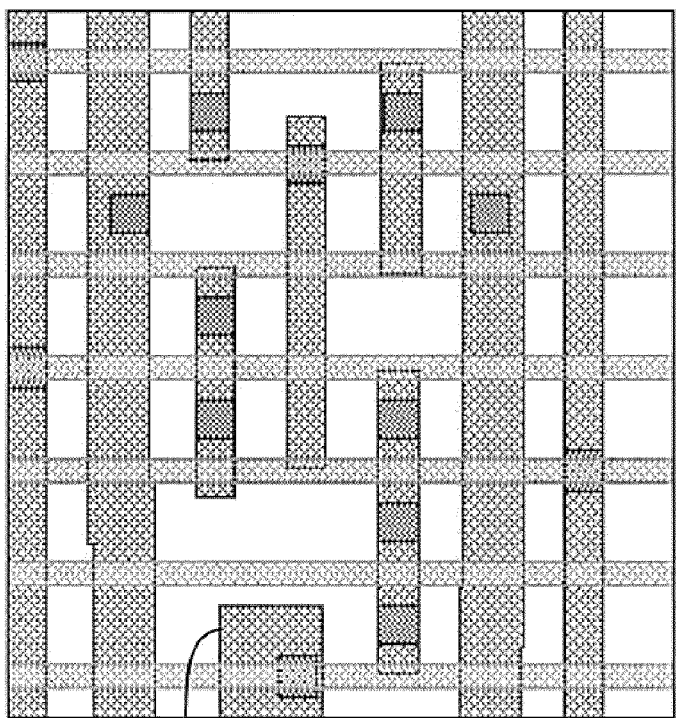
FIG. 11 compares examples of a (A) conventional layout and (B) a layout with predominantly 1-D routing.
Figure 11A:
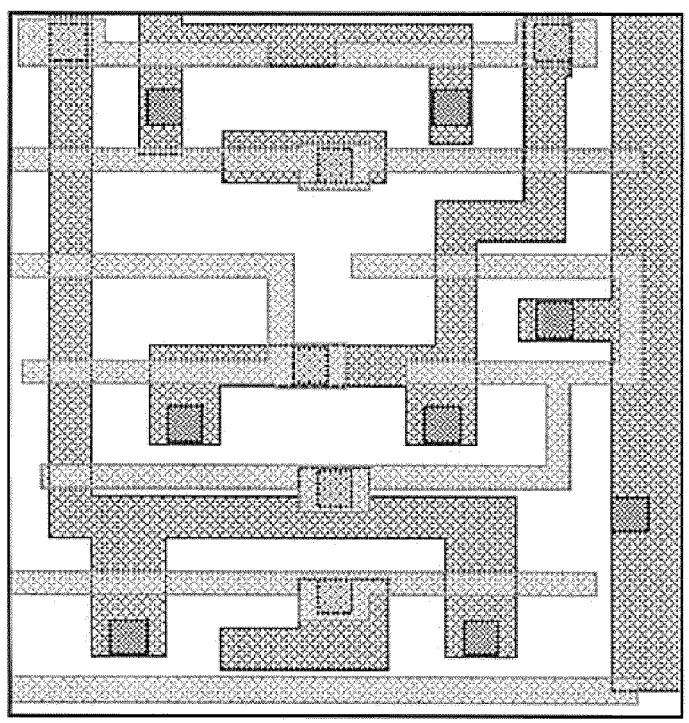

FIG. 11(A) shows an IC made by traditional routing design rules, and FIG. 11(B) shows an IC with predominantly 1-D routing, using a method and apparatus as described above. In FIG. 11(B), most patterns are horizontal or vertical, with a minimal number of vertices.

The present invention may be at least partially embodied in the form of computer-implemented processes and apparatus for practicing those processes. The present invention may also be at least partially embodied in the form of computer program code embodied in tangible machine readable storage media, such as random access memory (RAM), read only memories (ROMs), CD-ROMs, DVD-ROMs, BD-ROMs, hard disk drives, flash memories, or any other machine-readable storage medium, wherein, when the computer program code is loaded into and executed by a computer, the computer becomes an apparatus for practicing the invention. The present invention may also be embodied at least partially in the form of computer program code, for example, whether stored in a storage medium, loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The invention may alternatively be at least partially embodied in a digital signal processor formed of application specific integrated circuits for performing a method according to the principles of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
  (a) receiving an identification of a plurality of cells to be included in a layer of an integrated circuit (IC) layout, including a list of pairs of cells within the plurality of cells to be connected to each other;
  (b) using a computer to identify first routing paths to connect each of the pairs of cells for which 1-D routing is possible, using one-dimensional (1-D) routing between cells within those pairs of cells, said 1-D routing including either, but not both of, horizontal lines of the layer of the IC layout, to be formed using a first mask, or vertical lines of the same layer to be formed using a second mask;
  (c) using the computer to select second routing paths from a predetermined set of two-dimensional (2-D) routing patterns to connect only pairs of cells which cannot be connected by 1-D routing; and
  (d) outputting the first and second routing paths to a machine readable storage medium to be read by a control system for controlling a semiconductor fabrication process to fabricate the IC.

2. The method of claim 1, wherein step (b) includes applying a set of design rules that cause the first routing paths to be suitable for decomposition by double dipole lithography (DDL).

3. The method of claim 2, wherein the predetermined set in step (c) consists of patterns that are capable of being decomposed for DDL.

4. The method of claim 1, wherein step (b) includes applying a set of design rules that cause the first routing paths to be suitable for decomposition by double patterning technology (DPT).

5. The method of claim 4, wherein the predetermined set in step (c) consists of patterns that are capable of being decomposed for DPT.

6. The method of claim 1, further comprising locating connecting lines and vias exclusively on a manufacturing grid.

7. The method of claim 1, wherein step (b) includes positioning a plurality of connecting lines so that no pair of lines within the plurality of connecting lines are separated from each other by any of a finite number of predetermined pitch values.

8. The method of claim 1, further comprising:
  retrieving a complete set of the routing paths for the IC layout from the machine readable storage medium after step (d);
  performing double patterning decomposition design rule checks on the complete set of the routing paths for the IC layout; and
  correcting any design rule violation found in the complete set of routing paths.

9. The method of claim 1, wherein step (b) includes using an angle and a first line segment parallel to one side of the angle and separated from the one side by a first distance, in place of a pair of perpendicular second line segments separated from each other by the same first distance, if the pair of perpendicular second line segments is generated by a place and route tool and the first distance is less than a threshold distance.

10. The method of claim 1, wherein step (b) includes using a pair of angles in place of a pair of in-line first line segments, if the pair of first line segments is generated by a place and route tool and has a first distance between adjacent ends that is less than a threshold distance, each angle having a second line segment, the second line segments being parallel to each other and separated by the first distance.

11. An electronic design automation (EDA) tool comprising:
  a router for receiving an identification of a plurality of cells to be included in a layer of an integrated circuit (IC) layout, including a list of pairs of cells within the plurality of cells to be connected to each other, the router having a set of design rules for identifying first routing paths to connect each of the pairs of cells for which 1-D routing is possible, using one-dimensional (1-D) routing, between cells within those pairs of cells, said 1-D routing including either, but not both of, horizontal lines of the layer of the IC layout, to be formed using a first mask, or vertical lines of the same layer to be formed using a second mask; and
  a computer readable storage medium containing a predetermined set of two-dimensional (2-D) routing patterns;
  wherein the router is configured for selecting second routing paths from the predetermined set of 2-D routing patterns to connect only the pairs of cells which cannot be connected by 1-D routing; and
  the EDA tool is configured for outputting the first and second routing paths to be read by a control system for controlling a semiconductor fabrication process to fabricate the IC.

12. The EDA tool of claim 11, wherein the set of design rules cause the first routing paths to be suitable for decomposition by double dipole lithography (DDL).

13. The EDA tool of claim 12, wherein the predetermined set of 2-D routing patterns consists of patterns that are capable of being decomposed for DDL.

14. The EDA tool of claim 11, wherein the set of design rules cause the first routing paths to be suitable for decomposition by double patterning technology (DPT).

15. The EDA tool of claim 14, wherein the predetermined set of 2-D routing patterns consists of patterns that are capable of being decomposed for DPT.

16. The EDA tool of claim 11, wherein the set of design rules further configures the router for locating connecting lines and vias exclusively on a manufacturing grid.

17. The EDA tool of claim 11, wherein the set of design rules further configures the router for positioning a plurality of connecting lines so that no pair of lines within the plurality of connecting lines are separated from each other by any of a finite number of predetermined pitch values.

18. The EDA tool of claim 11, further comprising a module for:

performing double patterning decomposition design rule checks on the complete set of the routing paths for the IC layout; and correcting any design rule violation found in the complete set of routing paths.

19. A non-transitory computer readable storage medium encoded with computer program code, such that when the computer program code is executed by a processor, the processor performs a method comprising:

(a) receiving an identification of a plurality of cells to be included in a layer of an integrated circuit (IC) layout, including a list of pairs of cells within the plurality of cells to be connected to each other;

(b) using the processor to identify first routing paths to connect each of the pairs of cells for which 1-D routing is possible, using one-dimensional (1-D) routing between cells within those pairs of cells, said 1-D routing including either, but not both of, horizontal lines of the layer of the IC layout, to be formed using a first mask, or vertical lines of the same layer to be formed using a second mask;

(c) selecting second routing paths from a predetermined set of two-dimensional (2-D) routing patterns to connect only the pairs of cells which cannot be connected by 1-D routing; and (d) outputting the first and second routing paths to a machine readable storage medium to be read by a control system for controlling a semiconductor fabrication process to fabricate the IC.

20. The computer readable storage medium of claim 19, wherein step (b) includes applying a set of design rules that cause the first routing paths to be suitable for decomposition by double dipole lithography or double patterning technology.

* * * * *